United States Patent [19]

Antell

[11] Patent Number: 4,916,305
[45] Date of Patent: Apr. 10, 1990

[54] OPTICAL DETECTORS WITH SELECTIVE BIAS VOLTAGE APPLICATION

[75] Inventor: George R. Antell, Saffron Weldron, Great Britain

[73] Assignee: STC PLC, London, England

[21] Appl. No.: 266,389

[22] Filed: Nov. 2, 1988

[30] Foreign Application Priority Data

Nov. 3, 1987 [GB] United Kingdom ............... 8725687

[51] Int. Cl.$^4$ .................... H01J 40/14; H01L 27/14
[52] U.S. Cl. ............................ 250/211 J; 250/578.1; 357/30
[58] Field of Search ............................ 250/211 J, 578; 307/311; 455/619; 357/30

[56] References Cited

U.S. PATENT DOCUMENTS

| | | | |
|---|---|---|---|
| 4,368,385 | 1/1983 | Kanbe et al. | 250/211 J |
| 4,730,198 | 3/1988 | Brown et al. | 350/96.2 |
| 4,835,575 | 5/1989 | Plihal | 357/20 |

OTHER PUBLICATIONS

R. I. MacDonald and E. H. Hara, "Researchers Open Pathway to Video Switching Centers", *Canadian Electronics Engineering*, vol. 24, No. 4, Apr. 1980, pp. 18-20.

*Primary Examiner*—David C. Nelms
*Assistant Examiner*—Michael Messinger
*Attorney, Agent, or Firm*—Lee, Mann, Smith, McWilliams & Sweeney

[57] ABSTRACT

An optical detector comprises an array of PIN diodes each of which shows no photovoltaic output at zero bias but which can produce a photovoltaic output when correctly biased. A single amplifier is coupled to the array for amplifying produced photovoltaic voltages. When an optical signal incident on a particular PIN diode is required to be detected, that PIN diode is selectively and correctly biased by closure of an associated switch and the PIN diode output is amplified by the amplifier.

7 Claims, 1 Drawing Sheet

OPTICAL DETECTORS WITH SELECTIVE BIAS VOLTAGE APPLICATION

This invention relates to optical detectors and in particular to detectors comprising an array of photodetectors.

BACKGROUND OF THE INVENTION

Each photodetector of an array may be required to be responsive to a different wavelength signal. An incoming composite signal may comprise a number of different wavelength signals and have been transmitted down an optical fibre, for example such as in Optical transmission systems e.g. FDM (frequency division multiplexing) applications. The composite signal may be suitably split up, such as by a grating, whereby to address the respective photodetector of an array with the appropriate part of the composite signal. When several such optical signals are being received simultaneously by an array of photodetectors, it is sometimes required to process only one such signal at a time. In this case only a single amplifying channel is required behind the photodetectors. Normal PIN detectors cannot be used in such arrays with a single amplifying channel since they give an electrical output even when no voltage is applied across them, it being well known that a PIN detector will produce a photovoltaic signal under zero bias.

An array of photoconductors as photodetectors can be used successfully with a single amplifying channel since a photoconductor will only just give an output when a voltage is applied. There are, however, practical problems associated with photoconductors. Photoconductors for use at 1.3 to 1.5 um wavelengths are not well developed and may present problems in their frequency response. The high purity of the InGaAs which is required for the photoconductor is close to the best achievable at present.

It is thus an object of the present invention to provide an alternative form of optical detector.

SUMMARY OF THE INVENTION

According to the present invention there is provided an optical detector comprising an array of PIN diodes each of which can be biassed to show no photovoltaic output, a common amplifier connected to the PIN diodes' outputs, and means to selectively apply a bias voltage to each PIN diode of the array whereby when a said PIN diode is required to detect, the bias voltage is applied thereto and a photovoltaic output is produced in response to an optical signal incident thereon and amplified by said amplifier.

BRIEF DESCRIPTION OF THE DRAWINGS

Embodiments of the invention will now be described with reference to the accompanying drawings, in which.

DESCRIPTION OF PREFERRED EMBODIMENT

Figure 1:
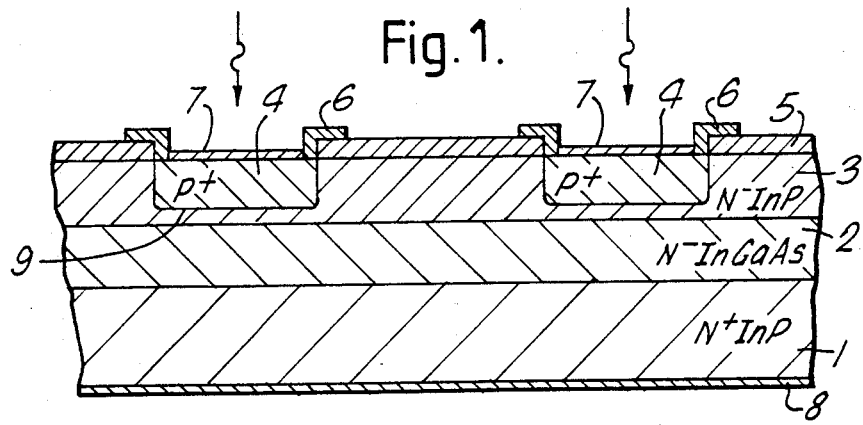
FIG. 1 shows a section through two diodes of an array.

It has been known for several years that it is possible to produce PIN detectors, based on the growth of InGaAs on InP, which show no photovoltaic output at zero bias but which act as normal detectors at a few volts bias. Two such detectors in an array are shown in FIG. 1, which comprises an $N^+$ InP substrate 1, an N-InGaAs layer 2 grown on the substrate, an $N^-$ InP layer 3 grown on layer 2, parts 4 of which layer 3 have been converted to $p^+$ by appropriate doping through a suitably apertured silicon nitride or silicon dioxide layer 5. Electrical contacts 6 are provided to the parts 4 and extend around the apertures of the layer 5. An antireflection coating film 7 is provided on the parts 4. A common electrical back contact 8 is provided on the back surface of the array, i.e. on the $N^+$ InP substrate. The PN junction 9 is formed in the InP layer (3,4) with the diffusion front stopping just short of the InGaAs layer 2. In a normal PIN detector the diffusion would extend into the InGaAs layer.

Figure 2:
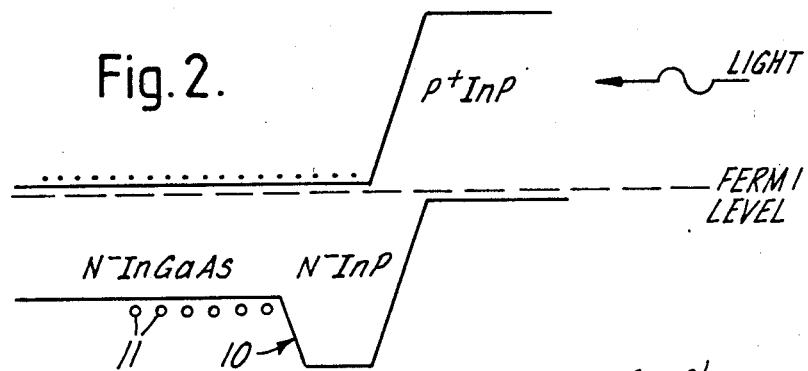
FIG. 2 is a simplified diagram of a built-in hole barrier at zero bias.

The simplified band structure of the PIN diode structure of FIG. 1 under zero bias is shown in FIG. 2. It can be seen that there is an internal built-in barrier at 10 between the N type InGaAs and InP which prevents photogenerated holes 11 in the InGaAs from moving out of the device and hence no photovoltaic output is generated at zero bias. When a reverse bias is applied, the depleted region extends into the InGaAs and the hole barrier is greatly reduced. The residual discontinuity in the valence band under reverse bias can, however, trap holes which are released over the barrier by thermionic emission. This trapping effect reduces the frequency response of the diode but may not be noticeable at frequencies of a few megahertz. For operation at higher frequencies the response of the diode can be speeded up by interposing a thin layer of InGaAsP having a band gap corresponding with a wavelength in the region of 1.3 um between the InGaAs 2 and the $N^-$ InP 3.

Figure 3:
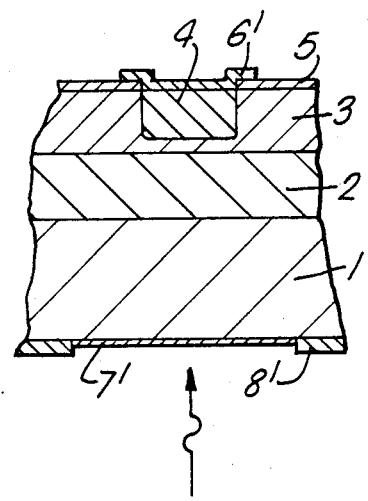
FIG. 3 shows an alternative diode construction in section.

The PIN diode structure illustrated in FIG. 1 detects light incident on its front (upper as illustrated) surface as indicated by the arrows. This can be referred to as the top entry configuration. In an array of diodes the diameter of the PN junction may be so small that the top entry configuration shown in FIG. 1 may not be practicable. The top entry configuration can, however, be replaced by a rear entry structure as illustrated in FIG. 3 in which the light is incident on the back surface of the array as indicated by the arrow. In this case the metal contact 6' to the PN junction covers the whole junction and light enters through an aperture in the back electrical contact 8'. To improve the efficiency this aperture is given an antireflection coating 7'. If required the array could be constructed on a high resistivity substrate.

Figure 4:
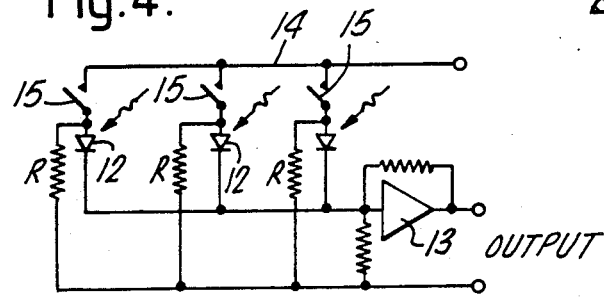
FIG. 4 shows, in an electrical form, an array of three diodes with a single amplifier.

Referring now to FIG. 4, there is shown therein an electrical diagram of an array comprising three PIN diodes 12 which have no photovoltaic output at zero bias and only give a photocurrent when correctly biased. The output of the array is taken from the common back contact (8, FIG. 1) which is coupled to a common following amplifier 13 which can be built monolithically on the same substrate as the array. Each diode 12 has a shunt resistor R across it and is connectable to a common voltage line 14 via a respective normally-open low leakage switch 15. The shunt resistors are provided since if the leakage current of a diode was less than that of the switch, the diode could be biased on. In use of the array of FIG. 3, the respective switch 15 is closed whereby to apply a suitable bias, for example 10 volts, to a particular PIN diode 12 which is then enabled to respond to an optical signal falling on it and produce a photovoltaic output for amplification by amplifier 13. The array of PIN diodes of the type described, having no photovoltaic output at zero bias, can thus pass signals individually to a common single amplifier whereas for an array of a normal PIN diodes which give a photovoltaic output even at zero bias the amplifier would see all signals. In the array with no photovoltaic voltage at zero bias PIN diodes there will thus be low crosstalk.

Typically an array may comprise up to 50 PIN diodes together with associated switches and shunt resistors and a single amplifier, which may all be integrated into a common substrate. The low leakage switches 15 may be comprised of switching transistors in a bistable arrangement as in the case of arrays of photoconductors, however the materials requirements for the special PIN diodes (no photovoltaic voltage at zero bias) is less demanding than that for photoconductors and thus are easier to produce.

I claim:

1. An optical detector array, comprising an $N^+$-type single crystal indium phosphide substrate on one major surface of which is provided a common electrical contact for the array and on the opposite major surface of which is provided a first, $N^-$-type indium gallium arsenide layer grown on the substrate, a second $N^-$-type indium phosphide layer grown on the first layer, an array of $P^+$-type regions disposed in the second layer and providing the optically responsive elements of the detector array, each said $P^+$-type region extending into the first layer but not into the second layer whereby to form a PN junction adjacent the boundary between the first and second layers so as to form a PIN diode structure, and means for selectively applying a bias voltage to each said PIN diode structure, wherein each said PN junction is so disposed relative to the boundary between the first and second layers that, when a said bias voltage is applied to said corresponding PIN diode structure, a depletion layer associated with that junction extends into the first layer thereby reducing a hole potential barrier associated with the PN junction and rendering that PIN diode selectively responsive to incident light.

2. An optical detector as claimed in claim 1, wherein said means for selectively applying a bias voltage includes a respective normally-open low leakage switch connected between a bias voltage source and each said PIN diode.

3. An optical detector as claimed in claim 2 and including a respective shunt resistor connected across each PIN diode.

4. An optical detector as claimed in claim 3 wherein the PIN diodes, the switches, the shunt resistors and the common amplifier are monolithically integrated into a single structure.

5. An optical detector as claimed in claim 1, further including a layer of indium gallium arsenide phosphide between the first and second layers.

6. An optical detector as described in claim 1, wherein the optical signals to be detected enter the $P^+$ regions in the second layer from the surface of the array opposite to the one surface of the substrate.

7. An optical detector as described in claim 1, wherein the optical signals to be detected enter the $P^+$ regions in the second layer from the one surface of the substrate.

* * * * *